United States Patent [19]
Droz

[11] Patent Number: 5,585,618
[45] Date of Patent: Dec. 17, 1996

[54] METHOD OF MANUFACTURE OF A CARD COMPRISING AT LEAST ONE ELECTRONIC ELEMENT AND CARD OBTAINED BY SUCH METHOD

[76] Inventor: François Droz, 46, rue de la Prairie, CH-2300 La Chaux-de-Fonds, Switzerland

[21] Appl. No.: 338,442

[22] PCT Filed: Mar. 14, 1994

[86] PCT No.: PCT/CH94/00055

§ 371 Date: Dec. 20, 1994

§ 102(e) Date: Dec. 20, 1994

[87] PCT Pub. No.: WO94/22110

PCT Pub. Date: Sep. 29, 1994

[30] Foreign Application Priority Data

Mar. 18, 1993 [CH] Switzerland ................ 819/93
Mar. 30, 1993 [FR] France ..................... 93 03821

[51] Int. Cl.[6] .................. G06K 19/06; G06K 19/02
[52] U.S. Cl. ............................. 235/492; 235/488
[58] Field of Search ................... 235/486, 487, 235/492; 29/592, 830

[56] References Cited

U.S. PATENT DOCUMENTS

| | | | |
|---|---|---|---|
| 4,460,825 | 7/1984 | Haghiri-Tehrani et al. | 235/488 |
| 4,843,225 | 6/1989 | Hoppe | 235/488 |
| 4,897,534 | 1/1990 | Haghiri-Tehrani | 235/488 |
| 5,399,847 | 3/1995 | Droz | 235/487 X |

FOREIGN PATENT DOCUMENTS

| | | | |
|---|---|---|---|
| 0326822 | 8/1989 | European Pat. Off. | 235/488 |
| 0334733 | 9/1989 | European Pat. Off. | 235/488 |
| 0350179 | 1/1990 | European Pat. Off. | 235/488 |
| 0503782 | 9/1992 | European Pat. Off. | 235/488 |
| 2601477 | 1/1988 | France | 235/488 |
| 2267683 | 12/1993 | United Kingdom | 235/488 |

*Primary Examiner*—Donald T. Hajec
*Assistant Examiner*—Thien Minh Le
*Attorney, Agent, or Firm*—Griffin, Butler, Whisenhunt & Kurtossy

[57] ABSTRACT

The present invention concerns a method of manufacture a method of manufacturing a card wherein there is supplied a compressible positioning structure (6), at least one electronic element (8) and a binder (12). The electronic element is positioned in a manner such that it is superposed onto the compressible positioning structure. In a first case, the binder (12) is supplied in liquid form. In another case, such binder is supplied in the form of a solid sheet, which is subsequently at least partially melted by applying energy. With the help of a press, pressure is applied to the various elements as supplied. The electronic element (8) then penetrates the positioning structure (6) and the binder spreads out so as to coat the electronic element (8). Finally there is obtained following solidification a solid card.

25 Claims, 3 Drawing Sheets

METHOD OF MANUFACTURE OF A CARD COMPRISING AT LEAST ONE ELECTRONIC ELEMENT AND CARD OBTAINED BY SUCH METHOD

FIELD OF THE INVENTION

The present invention concerns a card comprising at least one electronic element as well as a method of manufacture of such a card.

More specifically, the present invention concerns a method of manufacture of a card exhibiting no exterior contact.

The card according to the invention can, for example, be utilized as a bank card, as access card to a closed space, or again in association with a merchandise distributor. Such a card can also be used as means of identification or of checking.

BACKGROUND OF THE INVENTION

There is understood by card every object having a substantially planar structure defining a general plane and exhibiting any contour whatsoever in such general plane.

There is known to the person skilled in the art a card comprising electronic elements formed from a shell in which receptacles are provided intended to receive electronic elements and an outer protective layer which closes the receptacles.

There is also known a card having a symmetrical structure and formed from two substantially similar shells, each of these two shells having a structured surface serving to form receptacles intended to receive electronic elements when the two shells are assembled.

The method of manufacture of such latter card is generally as follows:

initially, each shell is formed with the help of an injection technique, for example by hot moulding.

secondly, the electronic elements are placed in one of the two shells and the other shell is thereafter placed on the first, the whole matter being assembled by a hot assembly technique.

The method of manufacture of the card described hereinbefore exhibits several drawbacks.

In particular, following hot assembly of the two shells, the electronic elements only partially fill the receptacles. This has as consequence that the card exhibits fragile zones in the places where the receptacles are situated, especially when the electronic elements incorporated in the card have relatively large dimensions. It is thus that when a winding is provided having a diameter on the order of size of the card, such a manufacturing method generates deformed zones (convexities or hollows) on the outer faces of the card this being naturally bad for the flatness of the card and for printing which can be provided on the outer surfaces of such card.

There is further known from patent document EP-0 350 179 a method of manufacture of a card consisting in placing in a mould two outer layers and an electronic assembly, then injecting a filler material in liquid form into such mould. Once hardened, such filler material forms an intermediate layer between the two outer layers.

In order to increase the rapidity of production, two chains are provided, each comprising several half-moulds coupled to one another. Both such chains are adapted to have a vertical motion and to form a mould with two corresponding half-moulds, respectively belonging to the two chains, exhibiting an opening, at least on the upper part thereof, in order to permit its filling. Above the place where the two corresponding half-moulds are assembled in order to form a mould, there is provided a nozzle permitting injection of the filling material in liquid form into the newly formed mould.

The method of manufacture of a card as described hereinbefore is complex. Additionally, for production of large quantities, such method of manufacture necessitates substantial material which renders it burdensome.

It will be further noted that the bringing in of the electronic assembly and its positioning during injection are nowhere described within the document considered here and are not evident. It is the same for the bringing of the outer layers into the half-moulds.

The card obtained by the method of manufacture described hereinbefore and such as described in patent document EP-0 350 179 is basically formed of three layers, namely an intermediate layer and two outer layers. On the interior of the intermediate layer is provided an electronic assembly formed of electronic elements, a winding arranged on its own support and an interconnection support, such interconnection support serving to couple electrically and rigidly the electronic elements and the winding.

A drawback of such card comes from the fact that the interconnection support and the support serving the winding increase the thickness of the card. Thus, it is difficult to obtain a thin card having a thickness of 0.76 mm prescribed by the ISO standard currently used for bank cards.

It will be furthermore noted that the method of manufacture proposed for such card does not assure that the interconnection support and the neighbouring outer layer are separated by a layer of filling material which is bad for good adhesion of such outer layer to the intermediate layer. Additionally, such method of manufacture does not guarantee a good positioning of the electronic assembly at the heart of the intermediate layer.

The present invention has as purpose to overcome the drawbacks described hereinbefore in proposing a method of manufacture of a card much less burdensome and well adapted to production of cards in large series, as well as proposing a solid card comprising at least one electronic element incorporated therewithin.

SUMMARY OF THE INVENTION

The present invention thus concerns a method of manufacture of a card characterized in that it includes a first group of steps including the following steps:

B) bringing at least one electronic element onto a work surface;

C) bringing a compressible positioning structure onto said work surface in a manner such that said electronic element is superposed onto said compressible positioning structure;

D) bringing a binder onto said work surface;

this first group of steps being followed by a second group of steps including the following steps:

G) application of pressure onto an assembly including said electronic element, said compressible positioning structure and said binder in order to cause, on the one hand, said electronic element to penetrate at least partially into said compressible positioning structure and, on the other hand, to permit said binder to form a mass in which said electronic element is immersed;

H) solidification of said mass formed by said binder at the time of said step G in a manner such that said mass rigidly binds said electronic element and said compressible positioning structure and solidifies this latter in a configuration resulting from said step G.

There results from the characteristics mentioned hereinabove that the method according to the invention is little burdensome. Effectively, such method necessitates only relatively simple and inexpensive material. Next, the manufacture according to the invention easily permits the fabrication of several cards simultaneously. It is thus well adapted to the production of cards in large series.

Next, the method of manufacture of a card according to the invention described hereinabove assures positioning of the electronic element at the heart of the card. Such positioning of the electronic element obtained by the penetration of the latter into the compressible positioning structure renders the method according to the invention particularly reliable. Additionally, this can be advantageous for several possible applications of the card obtained by such method of manufacture.

According to different variants in no way limitative of the method according to the invention, the compressible positioning structure is formed by a honeycomb structure, a structure constituted of woven or tangled threads, a corrugated sheet permeable to the binder or again embossed paper also permeable to the binder.

In a first case, the compressible positioning structure is formed by a single common piece while in a second case such compressible positioning structure is formed in two parts. In such latter case the electronic element is placed between such two parts.

According to a first embodiment of the method according to the invention, the binder brought in during step D is formed by a liquid. By way of example, the binder is formed by a resin brought in the form of a liquid which is viscous at ambient temperature, such resin having the property of hardening upon contact with the air.

According to a second embodiment of the method according to the invention described hereinbefore, the binder brought in during step D is formed by a solid meltable material. In such second embodiment, the method according to the invention includes, in the second group of steps, the following step as well:

F) applying energy serving to melt the binder at least partially.

In a preferred variant of the second embodiment of the method according to the invention, step G includes a first phase preceding step F in which the pressure applied onto the assembly serves to cause penetration of the electronic element into the compressible positioning structure and a second phase simultaneous with or subsequent to stage F in which the pressure applied onto the assembly permits the binder to form a mass in which the electronic element is immersed.

According to a specific characteristic of the method of manufacture of a card according to the invention, it is foreseen to bring at least one outer layer onto the work surface. Such outer layer is placed in a manner such that said assembly, including the electronic element, the compressible positioning structure and the binder is situated either on such outer layer or under such outer layer and that the electronic element is located between such outer layer and the compressible positioning structure. In the case in which two outer layers are provided, the latter are placed on either side of said assembly.

It will be noted that when no outer layer is provided, the work surface is non-adhesive to the binder.

The compressible positioning structure is chosen in a manner such that it permits lateral flow of the binder brought in during the entire process of manufacture of a card according to the invention. From this fact, the binder can spread out in a homogeneous manner in a plane substantially parallel to the plane of the work surface, which prevents formation of regions of overpressure during the step of application of pressure and permits the binder to coat correctly the electronic element and, where necessary, a winding. Additionally, an excess of binder can easily be evacuated laterally during step G.

In the case of the second embodiment and when outer layers are provided, the positioning structure assures maintenance of such outer layers during the application of energy serving to melt the binder at least partially. From this fact, the compressible positioning structure prevents that the outer layers shrink or ripple under the effect of the energy applied.

Thus, the positioning structure assures in the first place positioning of the electronic element and the various other elements provided in the card during the entire process according to the invention. Thereafter, it assures a lateral flow of the binder when the latter is in its liquid phase and in particular when a pressure is applied to this latter. Additionally, such compressible positioning structure assures in particular that the top outer layer, when such latter is provided, remains substantially planar throughout the process.

When an energy applying step is provided, it will be noted that the binder advantageously exhibits a melting temperature lower than the melting temperature of the material constituting the top outer layer and/or the bottom outer layer when present.

In a third embodiment of the method, the material chosen for the binder, the quantity of energy applied and the pressure exerted on such binder are chosen in a manner such that the binder compresses and entirely penetrates the compressible positioning structure in a manner such that the compressible positioning structure is entirely included in the mass formed by the binder, such mass then exhibiting an upper surface region and a lower surface region defining respectively first and second outer layers.

The present invention has also as object a card comprising at least one electronic element and a layer formed by a binder in which is immersed said electronic element, such card being characterized in that it comprises a compressed positioning structure located at the interior of said layer formed by said binder, such compressed positioning structure defining an internal zone in the interior of which is positioned said electronic element.

According to a specific embodiment, the card comprises moreover a winding having two electrical contact ends directly coupled to the electronic element as provided.

Finally, according to another specific embodiment of the card according to the invention, such latter comprises a first outer layer and a second outer layer, the layer formed by the binder constituting an intermediate layer between such first and second outer layers, at least the major portion of the internal surface of each of such first and second outer layers being covered over by the binder, such latter assuring cohesion of such first and second outer layers with the intermediate layer.

Other characteristics and advantages of the present invention will also be set forth with the help of the following description prepared with reference to the accompanying drawings which are intended to be in no manner limiting.

DESCRIPTION OF PREFERRED EMBODIMENTS

Figure 1:
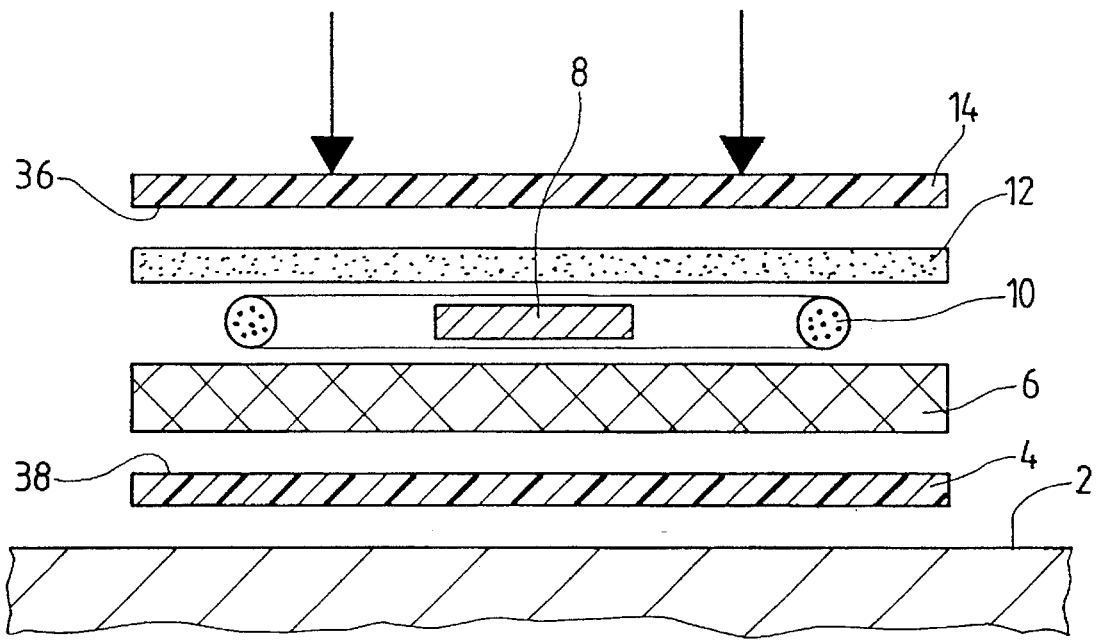
FIG. 1 shows schematically a first embodiment of the implementation of the method of manufacture of a card according to the invention.

It will be noted that in the various embodiments of implementation of the method of manufacture of a card according to the invention shown on FIGS. 1, 2, 3 and 6, the various elements coming into consideration are shown schematically in crosssection. In each of such figures, the plane of cross-section chosen corresponds to a plane perpendicular to the general plane of the card obtained by the method according to the invention.

Referring to FIGS. 1, 2, 4, 5 and 8, there will hereinafter be described a first implementation of the method according to the invention as well as first and second embodiments of a card according to the invention obtained by such first implementation of the method according to the invention.

According to this first implementation of the method, there is provided the bringing onto a work surface 2 of a first outer layer 4. On such outer layer 4 is brought a compressible positioning structure 6. Next, an electronic element 8 and a winding 10 are brought in and placed on the compressible positioning structure 6. A binder 12 in the form of a solid leaf is also brought onto the work surface 2 and placed on the electronic element 8 and winding 10. Onto such sheet of binder 12 is further brought a second outer layer 14.

It will be noted that on FIG. 1 the compressible positioning structure 6 and the sheet of binder 12 are brought onto the work surface 2 in a manner independent from the outer layers 4 and 14.

Figure 2:
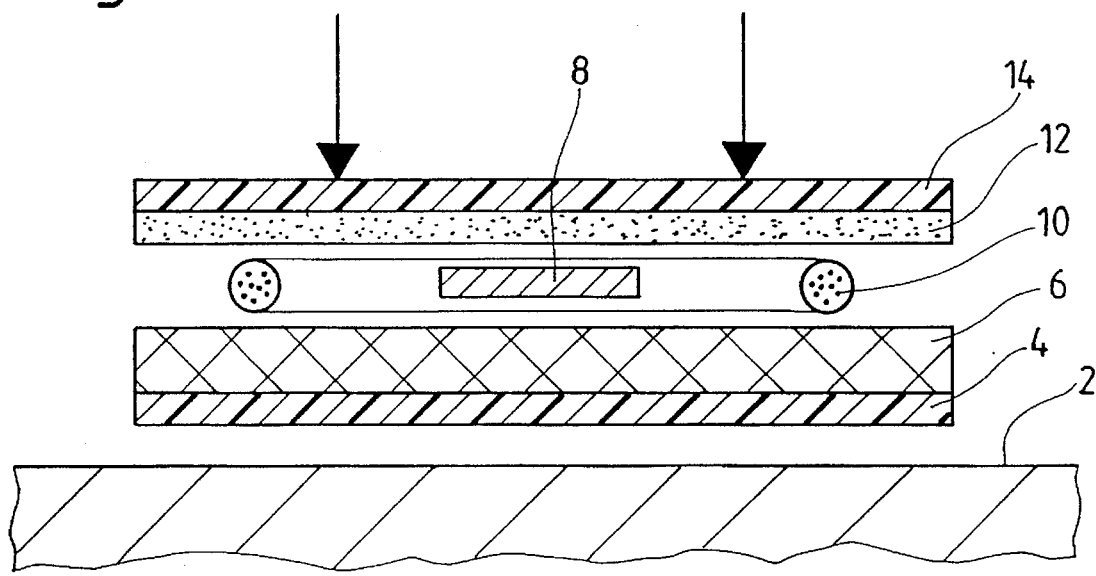
FIG. 2 shows schematically a variant of the first implementation of FIG. 1.

On the other hand, in a variant of the first implementation shown on FIG. 2, the compressible positioning structure 6 and the sheet of binder 12 are respectively assembled beforehand with the two outer layers 4 and 14 before being brought onto the work surface 2. This can be advantageous to facilitate bringing in the different elements provided for the manufacture of the card according to the invention.

Once the various elements mentioned above are brought in, there is provided the application of pressure with the help of a press (schematically indicated by two arrows) onto the assembly of the elements brought in, in particular on the electronic element 8 and winding 10. This has as effect to permit such electronic element 8 and such winding 10 to penetrate at least partially into the compressible positioning structure 6. Such penetration is effected either by crushing or by compression of the compressible positioning structure 6. From this fact, the electronic element 8 and winding 10 are immediately positioned relative to the compressible positioning structure 6, such electronic element 8 and such winding 10 forming an internal zone in which they are maintained under the effect of the applied pressure. Thus, positioning of the electronic element 8 and winding 10 is assured.

In the case of such first implementation of the method, there is provided the application of energy serving to melt at least partially the sheet of binder 12. Here it will be noted that the binder 12 is constituted by a meltable material. In a preferred manner, the melting temperature of such meltable material is lower than the melting temperature of the material making up the outer layers 4 and 14.

Parallel to the application of heat, the application of pressure is maintained in a manner to permit the binder 12 to form a mass in which the electronic element 8 and the winding 10 are immersed. In the case of the variant of FIG. 1, the compressible positioning structure 6 is permeable to the binder 12 when the latter is melted. From this fact, binder 12 can penetrate the compressible positioning structure 6 and pass through it in a manner such that such compressible positioning structure 6 is entirely immersed in the binder 12, which then forms an intermediate layer between the outer layers 4 and 14 as such is shown on FIG. 4.

Figure 4:
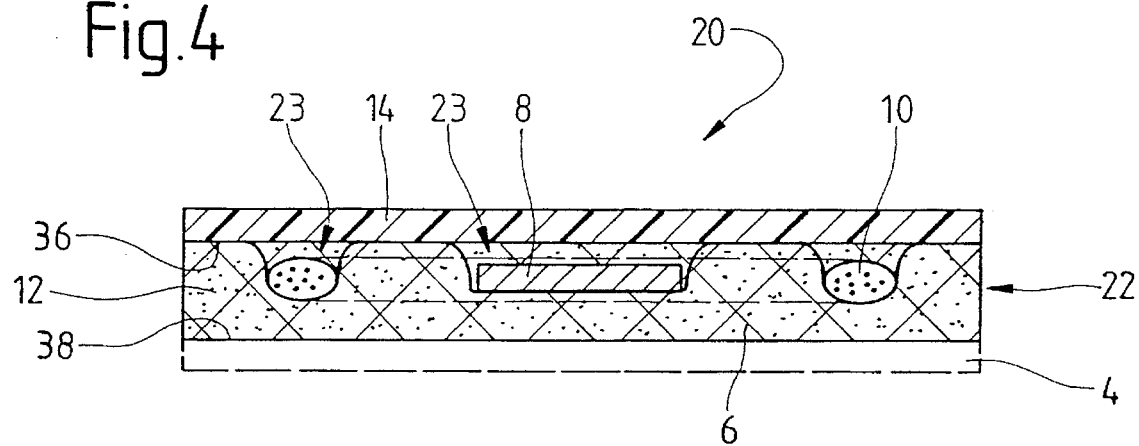
FIGS. 4 and 5 show schematically and in cross-section a card according to the first and second embodiments of the invention.

On such FIG. 4, card 20 comprises in a first variant a first outer layer 4, while in a second variant such outer layer 4 is omitted. Card 20 also comprises an intermediate layer 22 formed by binder 12 in which electronic element 8, winding 10 and the compressed positioning structure 6 are immersed. Card 20 further comprises an outer layer 14 covering over the electronic element 8, the winding 10 and the positioning structure 6. The electronic element 8 and the winding 10 are located in an internal zone 23 of the compressible positioning structure 6, such latter being in a compressed configuration.

Binder 12 and the material forming the outer layer 14 and, where present, the outer layer 4, are chosen in a manner such that the intermediate layer 22 adheres solidly to the outer layers 4 and 14 following solidification of the binder. By way of an example in no way limiting, the binder is constituted either by a resin or by a plastic material. The resin can be in particular a two-component glue hardening upon contact with the air, and the plastic material can be a polyvinyl chloride. The outer layers 4 and 14 are constituted for example by a plastic material, in particular a polyvinyl chloride or polyurethane.

It will be noted that the melting temperature of the compressible positioning structure 6 is greater than the melting temperature of binder 12.

It will be further noted that the order in which the compressible positioning structure 6, the electronic element 8, winding 10 and the sheet of solid binder 12 are brought in can be any order whatsoever. Next the compressible positioning structure 6 can be formed from a single piece or two parts. Likewise, the binder brought in can be formed by a single sheet of binder or by two sheets of binder arranged on either side of the compressible positioning structure 6. In addition, it is possible to not provide outer layers 4 and 14. In such case, there results from the manufacturing method according to the invention a card such as that shown on FIG. 8.

Figure 8:
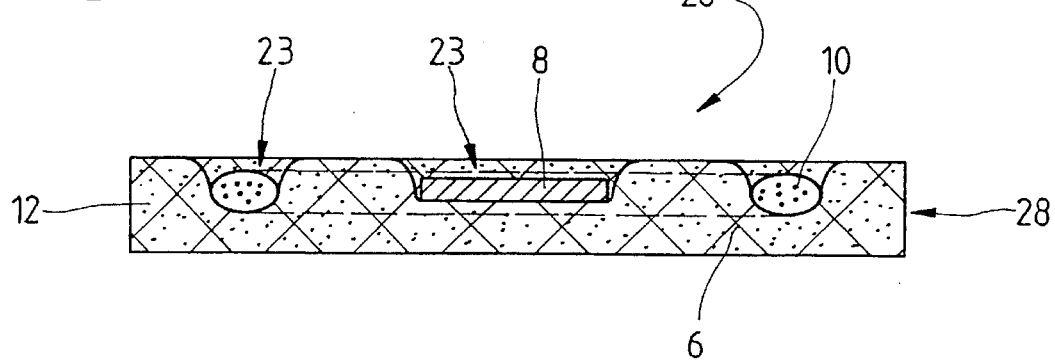
FIG. 8 shows schematically and in cross-section a variant of the second embodiment of a card according to the invention.

On such FIG. 8 the card 26 comprises a single layer 28 formed by the binder 12 in which are immersed the electronic element 8, the winding 10 and the compressed positioning structure 6 This latter shows again an internal zone 23 in which are located the electronic element 8 and the winding 10.

According to different variants of this first implementation of the method according to the invention, the compressible positioning structure 6 is formed either by an expanded material such as a foam, or by a honeycomb structure or again by an assembly of woven or tangled threads.

According to two other variants, the compressible positioning structure 6 is formed either by an embossed paper permeable to binder 12 or exhibiting perforations, or by a corrugated sheet likewise permeable to the binder 12 or exhibiting perforations.

Figure 5:
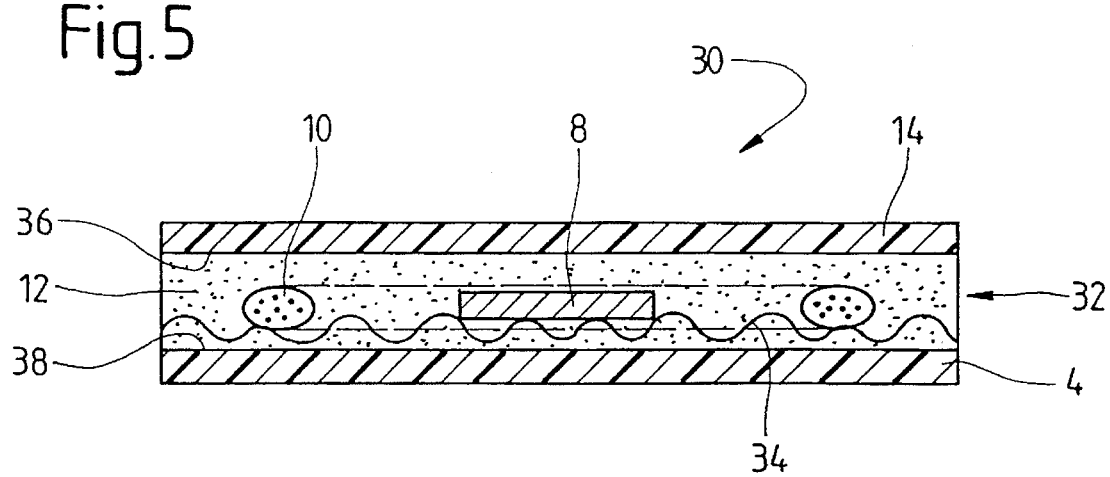

The card obtained by this last variant of the first implementation of the method according to the invention is shown schematically on FIG. 5.

On such FIG. 5, card 30 comprises a first outer layer 4 and a second outer layer 14. The card 30 also comprises an intermediate layer 32 formed by the binder 12 and in which are immersed the electronic element 8, winding 10 and the positioning structure formed by a compressed corrugated sheet 34.

All the compressible positioning structures mentioned hereinbefore exhibit the characteristic of permitting a lateral flow of the binder 12. Likewise, each of such compressible positioning structures can be penetrated by the binder 12 when this latter is in the form of a viscous liquid and when pressure is applied onto the latter. Each of the compressible positioning structures mentioned hereinabove thus permits the binder 12 to form a compact mass in which the electronic element 8, the winding 10 and the compressible positioning structure are immersed. Thus, the respective internal surfaces 36 and 38 of the outer layers 4 and 14 are practically entirely covered over by binder 12. From this fact, it is possible to assure very good cohesion between the intermediate layer 22 or 32 and the outer layers 4 and 14 arranged on either side of such intermediate layer 22 or 32.

It will be further noted that the compressible positioning structure 6 permits not only lateral flow of the melted binder 12, but also lateral flow of the air to be found in the intermediate region between the outer layer 4 and the outer layer 14. From this fact, if the sheet of binder 12 is melted in a manner so that the binder has the consistency of a viscous liquid, such binder 12, under the effect of the pressure applied on the outer layer 14 progressively fills this intermediate region in a manner such that the resulting card includes very little residual air.

Figure 3:
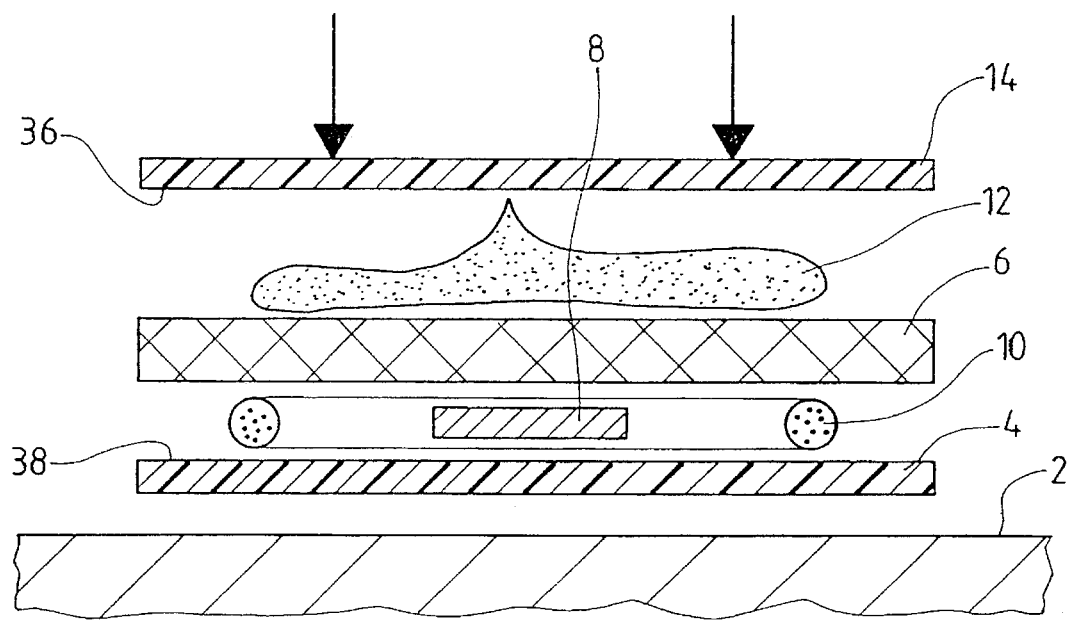
FIG. 3 shows schematically a second embodiment of the implementation of the method of manufacture of a card according to the invention.

Referring hereafter to FIG. 3 and to FIGS. 4, 5 and 8 already described, there will be described hereinafter after a second implementation of the method of manufacture of a card according to the invention.

Such second implementation differs basically from the first implementation in that the binder is brought in liquid form, in particular in the form of a liquid showing high viscosity and in that the application of energy serving to melt the sheet of binder in the first embodiment is no longer necessary.

Such second implementation thus shows the basic advantage of not necessitating any application of energy nor of means serving for such application of energy.

As far as concerns the other steps of the method and the various characteristics of the elements making up the manufactured card, they are similar to those of the first implementation described hereinbefore. From this fact, these various steps and characteristics of these materials employed will not be again described here.

There will be mentioned only that the application of the binder can be effected in two phases, the first phase consisting in an application of a first portion of the binder 12 directly on the outer layer 4, the second portion of binder being applied onto the compressible positioning structure 6. From this fact, it is possible even better to assure that the electronic element 8 and the compressible positioning structure are correctly coated by the binder 12 in a manner such that the respective internal surfaces 36 and 38 of the outer layers 4 and 14 are almost entirely covered over by binder 12. The card obtained thus exhibits very good cohesion as a whole.

Figure 6:
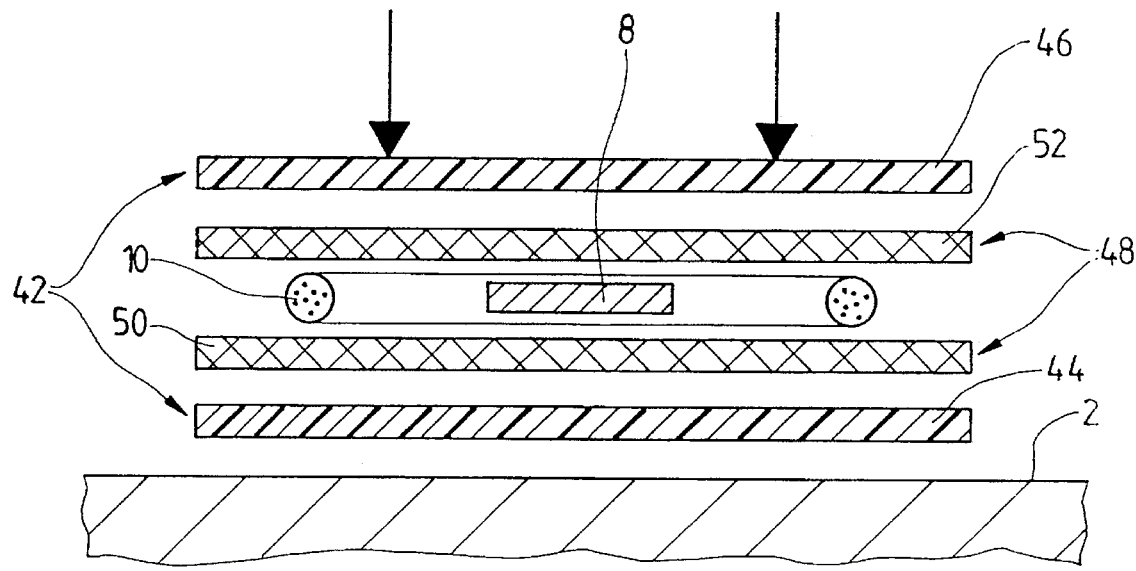
FIG. 6 shows schematically a third implementation of the method according to the invention.

In referring to FIGS. 6 and 7, there will be described hereinafter a third implementation of the method according to the invention, as well as a card according to the invention obtained by such third implementation.

According to such third implementation, there is brought onto the work surface 2 a binder 42 formed by a first solid layer 44 and a second solid layer 46. It is also provided to bring a compressible positioning structure 48 formed by a first portion 50 and a second portion 52. An electronic element 8 and a winding 10 are likewise brought in. Here it will be noted, as in the other implementations described hereinbefore, that the winding 10 has two electrical contact ends which are preferably directly connected to the electronic element 8. From this fact, the electronic element 8 and the winding 10 form an assembly without a rigid support assuring a rigid mechanical connection between such electronic element 8 and such winding 10. Thus, it is possible to obtain thin cards.

The positioning structure 48, the electronic element 8 and winding 10 are brought in a manner such that the electronic element 8 and the winding 10 are located between the first part 50 and the second part 52 of the compressible positioning structure 48. The two portions 44 and 46 of binder 42 are placed on either side of the compressible positioning structure 48.

With the help of a press (shown schematically by two arrows), pressure is applied onto the assembly of elements brought in and an application of energy serving to melt the binder 42 at least partially is provided. Under the effect of the applied pressure the electronic element 8 and winding 10 penetrate into the compressible positioning structure 48, the two portions 10 and 50 of which come together thus closing in the interior of such structure 48 the electronic element 8 and the winding 10.

The material for the binder 42, in particular a plastic material such as polyvinyl chloride, the thickness of each of the two parts 50 and 52 of the compressible positioning structure 48 and the quantity of energy applied are chosen in order that the binder 42, in melting, penetrates the compressible positioning structure 48 in a manner to immerse such positioning structure 48 with the electronic element 8 and the winding 10, while leaving a layer of binder on either side of the positioning structure 48.

Figure 7:
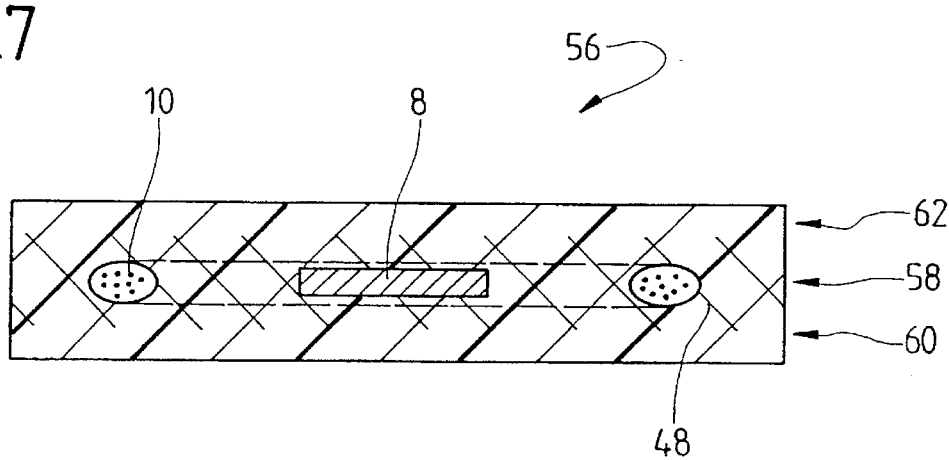
FIG. 7 shows schematically and in cross-section a third embodiment of a card according to the invention resulting from the third implementation of the method.

From this fact, such third implementation of the method according to the invention permits obtaining a card formed from one common material, as is shown on FIG. 7.

On such FIG. 7, card 56 is formed in a single block on the interior of which is comprised the electronic element 8, winding 10 and the compressed positioning structure 48. There is thus distinguished in such card 56 an intermediate region 58 in which are located the compressed positioning structure 48, the electronic element 8 and the winding 10 and first and second surface regions 60 and 62, each defining an outer layer showing a smooth planar surface.

Such third implementation of the method according to the invention is thus basically distinguished from the other two implementations through the fact that the material forming the binder of the various elements brought in serves at the same time for the formation of two surface regions 60 and 62, each defining an outer layer.

It will be noted that the method of manufacture according to the invention permits in each of these implementations described hereinbefore to manufacture several cards simultaneously on the same work surface. In order to accomplish this, there is fashioned according to the method of the invention, a plate the dimensions of which projected on the work surface correspond to those of several cards. This exhibits no supplementary difficulty of implementation relative to the manufacture of a single card.

With the help of the first implementation of the method according to the invention shown on FIG. 1, there will be briefly described the method of manufacture of several cards simultaneously according to such first implementation.

In a manner similar to the first implementation, there is provided the bringing onto the work surface of a first outer layer, the dimensions of which in projection on such work surface, correspond at least to those of several manufactured cards. Next, a compressible positioning structure of the same dimensions is brought in and placed on the first outer layer.

In the case where it concerns the fashioning of several identical cards, it is provided the bringing onto the compressible positioning structure of several electronic assemblies, each including for example an electronic element 8 and a winding 10. Each of such electronic assemblies is placed on the compressible positioning structure at a defined place. In particular such various assemblies are placed in a manner to exhibit a certain spatial positioning regularity on the compressible positioning structure.

Next, a sheet of binder having the dimensions of the first outer layer and of the compressible positioning structure is brought in facing these two latter. A second outer layer is further brought in onto the sheet of binder and pressure is exerted on this latter in a manner to cause penetration at least partially of the electronic assemblies into the compressible positioning structure.

From this fact, each electronic assembly is maintained by the compressible positioning structure at the place relative to a projection on the work surface where it was initially placed.

Just as in the first implementation, an application of energy is provided to melt at least partially the sheet of binder and pressure is exerted on such binder in a manner such that it penetrates the positioning structure in coating over the several electronic assemblies in order to form finally a mass defining an intermediate layer between the first and second outer layers, the electronic assemblies and the compressed positioning structure being immersed in such mass.

Here it will be noted that the step of applying energy and the step of application of pressure on the several brought in elements can be simultaneous. The person skilled in the art can readily determine the most advantageous timing parameters for such two steps.

Following a solidification step, there is provided a final step of cutting out each card. Such cutting out step is effected in a manner such that the contour provided for each of the fashioned cards does not intercept any of the internal zones in which the electronic assemblies are positioned.

Being given that the positioning structure guarantees the positioning of the various electronic assemblies during the entire process of fabrication according to the invention, such cutting out step does not risk damaging the electronic assemblies.

It will thus be noted that the method of manufacture according to the invention is particularly well adapted to the manufacture of several cards simultaneously on the same work surface. All the elements brought in are simple and do not exhibit any manufacturing difficulty. Additionally, the process is reliable and assures a good quality of the cards manufactured.

In particular, the compressible positioning structure permits that a surplus of binder can be laterally evacuated and thus prevent formation of regions exhibiting an over-pressure, which would be damaging for the electronic assemblies and for the flatness of the card obtained.

I claim:

1. Method of manufacture of a card, characterized in that it includes a first group of steps including the following steps:

B) bringing at least one electronic element (8) onto a work surface (2);

C) bringing a compressible positioning structure (6;34;48) onto said work surface in a manner such that said electronic element is superposed onto said compressible positioning structure;

D) bringing a binder (12;42) onto said work surface;

this first group of steps being followed by a second group of steps including the following steps:

G) application of pressure onto an assembly including said electronic element (8), said compressible positioning structure (6;34;48) and said binder (12;42) in order to cause, on the one hand, said electronic element to penetrate at least partially into said compressible positioning structure and, on the other hand, to permit said binder to form a mass in which said electronic element is immersed;

H) solidification of said mass formed by said binder (12;42) at the time of said step G in a manner such that said mass rigidly binds said electronic element (8) and said compressible positioning structure (6;34;48) and solidifies this latter in a configuration resulting from step G.

2. Method according to claim 1, characterized in that said binder (12;42) supplied during step D is formed by a viscous liquid.

3. Method according to claim 1, characterized in that said binder (12;42) supplied during step D is formed by a meltable solid material and in that the second group of steps also includes the following step:

F) supplying energy serving to melt said binder at least partially;

said step H being subsequent to said step F.

4. Method according to claim 3, characterized in that said step G includes a first phase, preceding said step F, in which said pressure applied to said assembly serves to cause at least partial penetration of said electronic element (8) into said compressible positioning structure (6;34;48) and a second phase simultaneous with or subsequent to said step F in which said pressure applied to said assembly permits said binder to form a mass in which said electronic element is immersed.

5. Method according to claim 1, characterized in that said compressible positioning structure (6;34;48) is entirely immersed in said binder after said step G.

6. Method according to claim 1, characterized in that said first group of steps further includes the following step:

A) bringing an outer layer (4) onto said work surface and the positioning of such outer layer in a manner such that said assembly is located on sad outer layer.

7. Method according to claim 1, characterized in that said first group of steps further includes the following step:

E) bringing an outer layer (14) onto said assembly.

8. Method according to claim 6, characterized in that said steps G and H also serve to bind solidly said outer layer (4;14) to said mass formed by said binder (12).

9. Method according to claim 1, characterized in that said compressible positioning structure (6;48) is formed by an expanded material.

10. Method according to claim 9, characterized in that said compressible positioning structure (6;48) is formed by a foam.

11. Method according to claim 1, characterized in that said compressible positioning structure (6;48) is formed by a honeycomb structure.

12. Method according to claim 1, characterized in that said compressible positioning structure (6;48) is formed by an assembly of woven or tangled threads.

13. Method according to any of claim 1, characterized in that said positioning structure (34) is formed by a corrugated sheet permeable to said binder or exhibiting perforations.

14. Method according to claim 1, characterized in that said compressible positioning structure (6;48) is formed by an embossed paper permeable to said binder or exhibiting perforations.

15. Method according to claim 1, characterized in that said compressible positioning structure (48) comprises a first part (50) and a second part (52), such first and second parts being respectively arranged on either side of said electronic element (8).

16. Method according to claim 1, characterized in that said binder (12;42) as applied is formed by a resin, such resin hardening during said step H at ambient temperature.

17. Method according to claim 1, characterized in that said binder (12;42) is constituted by a plastic material.

18. Method according to claim 2, characterized in that said binder (12) is applied in two phases, the first phase consisting in an application of a first portion of said binder before said steps B and C, the second phase consisting in applying a second portion of said binder after such steps B and C.

19. Method according to claim 3, characterized in that said binder (42) as applied is formed by two sheets (44;46) arranged on either side of said compressible positioning structure (48) and said electronic element (8).

20. Method according to claim 7, characterized in that at least a portion of said binder (12) is assembled beforehand with said outer layer (14) before being brought in.

21. Method according to claim 6, characterized in that said compressible positioning structure (6) is assembled beforehand with said outer layer (4) before being brought in.

22. Method according to claim 1, characterized in that there is supplied at the time of said step B a coil (10) having two electrical coupling ends directly connected to said electronic element (8).

23. Card (20;26;30;56) comprising at least one electronic element (8) and a layer 22;28;32;58 formed by a binder (12;42) in which said electronic element is immersed, such card being characterized in that it comprises a compressed positioning structure (6;34;48) located in the interior of said layer formed by said binder, such compressed positioning structure defining an internal zone (23) in the interior of which said electronic element is positioned.

24. Card (20;26;30;56) according to claim 23, characterized in that it comprises a coil (10) having two electrical contact ends directly coupled to said electronic element (8), the electronic element forming with said coil an assembly coated by said binder (12;42).

25. Card (20;30) according to claim 23, characterized in that it comprises a first outer layer (4) and a second outer layer (14), said layer (22;32) formed by said binder (12) constituting an intermediate layer between said first and second outer layers, at least the major part of the internal surface (36;38) of each of such first and second outer layers being covered over by said binder, the binder assuring the cohesion of such first and second outer layers with said intermediate layer.

* * * * *